United States Patent
Qiu et al.

(10) Patent No.: US 8,768,900 B2
(45) Date of Patent: Jul. 1, 2014

(54) METHOD AND DEVICE FOR COMPRESSING, DECOMPRESSING AND QUERYING DOCUMENT

(71) Applicants: Peking University Founder Group Co., Ltd., Beijing (CN); Beijing Founder Apabi Technology Ltd., Beijing (CN); Peking University, Beijing (CN)

(72) Inventors: Ruiheng Qiu, Beijing (CN); Wei Hu, Beijing (CN)

(73) Assignees: Peking University Founder Group Co., Ltd., Beijing (CN); Beijing Founder Apabi Technology Ltd., Beijing (CN); Peking University, Beijing (CN)

( * ) Notice: Subject to any disclaimer, the term of this patent is extended or adjusted under 35 U.S.C. 154(b) by 0 days.

(21) Appl. No.: 14/119,172

(22) PCT Filed: Dec. 31, 2012

(86) PCT No.: PCT/CN2012/088009
§ 371 (c)(1),
(2), (4) Date: Nov. 20, 2013

(87) PCT Pub. No.: WO2013/097802
PCT Pub. Date: Jul. 4, 2013

(65) Prior Publication Data
US 2014/0089277 A1    Mar. 27, 2014

(30) Foreign Application Priority Data
Dec. 30, 2011 (CN) .......................... 2011 1 0456661

(51) Int. Cl.
*G06F 17/30* (2006.01)
*G06F 17/00* (2006.01)

(52) U.S. Cl.
USPC .................. 707/693; 707/999.101; 709/247; 715/242

(58) Field of Classification Search
USPC ............. 707/693, 999.101; 709/247; 715/242
See application file for complete search history.

(56) References Cited

U.S. PATENT DOCUMENTS

| | | | |
|---|---|---|---|
| 6,883,137 B1 * | 4/2005 | Girardot et al. | 715/242 |
| 7,539,692 B2 * | 5/2009 | Min et al. | 1/1 |
| 7,630,997 B2 * | 12/2009 | Zhang et al. | 1/1 |
| 2004/0139392 A1 * | 7/2004 | Kreiner et al. | 715/513 |

(Continued)

FOREIGN PATENT DOCUMENTS

| | | |
|---|---|---|
| CN | 1547326 A | 11/2004 |
| CN | 102214170 A | 10/2011 |

OTHER PUBLICATIONS

Wei, Research on Seconde Index Technology for XML Data, Chinese Master's Theses Full-text Database Information Science and Technology, Apr. 15, 2011, No. 4 pp. 38-98.

*Primary Examiner* — Yicun Wu
(74) *Attorney, Agent, or Firm* — The Webb Law Firm (57) ABSTRACT

A method for processing an XML document with a schema includes extracting structure content and data content of an XML document, determining path coding of a node in the structure content, and determining data content corresponding to the node according to a pre-stored preorder of the node, wherein the path coding of the node identifies a storage position of the node in the structure content through the node and other nodes in the structure content, and compressing respectively the node, the path coding of the node and the data content.

15 Claims, 6 Drawing Sheets

(56) References Cited

U.S. PATENT DOCUMENTS

| | | | |
|---|---|---|---|
| 2004/0225754 A1* | 11/2004 | Lee | 709/247 |
| 2005/0144556 A1 | 6/2005 | Petersen et al. | |
| 2007/0162479 A1* | 7/2007 | Begun et al. | 707/101 |

* cited by examiner

METHOD AND DEVICE FOR COMPRESSING, DECOMPRESSING AND QUERYING DOCUMENT

CROSS REFERENCE TO RELATED APPLICATIONS

This application claims the benefit of Chinese Patent Application No. 201110456661.1, filed on Dec. 30, 2011, which is incorporated herein by reference in its entirety as part of this application.

TECHNICAL FIELD

The present application relates to the field of computer application technology, and in particular, to a method and a device for compressing, decompressing and querying a document.

BACKGROUND

XML (Extensible Markup language) has been widely used as a common data storage language. Since there is large data redundancy in XML documents, dedicated XML compressing methods are usually used in practice to compress the data of an XML document. Generally, there are two common XML compressing methods:

The first compressing method is one that does not enable querying. To query and obtain some XML data from an XML document compressed with such a method, the XML document needs to be decompressed first, and then queried to obtain the results.

The second compressing method is one that enables querying. Such a method enables querying and obtaining some XML data from a compressed XML document directly. This method uses query languages such as XPath, XQuery, etc., for querying the compressed XML document. These query languages retrieve information from an XML document based on a path, which is a sequence comprising all the nodes that have been visited between a certain node to a target node in the XML document. The path may be denoted by a string encoding the visited nodes and some special symbols. XPath does not focus on textual representation of XML data, but operates over an underlying abstract logical structure tree. The name of XPath is derived from using a path representation similar to that in an Uniform Resource Identifier (URI) to travel and locate in the hierarchical structure of the XML data. To achieve the main purpose of XPath for locating a specific data segment in an XML document, basic strings, numerical values and Boolean processing functions have been provided in the XPath specification.

The conventional art cannot effectively compress and decompress an XML document having a corresponding Schema and enable query operation in a compressed state.

SUMMARY

In order to solve the problem in the art, according to one aspect of the disclosure, a method and a device for compressing an XML document having a corresponding Schema are provided herein.

In some embodiments, the method for compressing an XML document having a corresponding Schema may comprise:

extracting structure content and data content of an XML document, wherein the structure content comprises the content in labels (or tags) of the XML document excluding attribute values in the labels and content between the labels;

determining path coding of a node in the structure content, and determining the data content corresponding to the node according to a pre-stored preorder of the node, wherein the path coding of the node identifies a storage position of the node in the structure content through the node and other nodes in the structure content; and processing the node in the structure content and the path coding of the node by a preset method, and compressing respectively the processed node, the processed path coding of the node, and the data content.

In some embodiments, the device for compressing an XML document having a corresponding Schema may comprise:

an extracting unit configured to extract structure content and data content of an XML document, wherein the structure content comprises the content in labels of the XML document excluding attribute values in the labels and content between the labels;

a determining unit configured to determine path coding of a node in the structure content, and determine data content corresponding to the node according to a pre-stored preorder of the node, wherein the path coding of the node identifies a storage position of the node in the structure content through the node and other nodes in the structure content; and a compressing unit configured to process the node in the structure content and the path coding of the node by a preset method, and compress respectively the processed node, the processed path coding of the node, and the data content.

According to another aspect of the disclosure, a method and a device for decompressing an XML document having a corresponding Schema compressed by the above compressing method are provided herein.

In some embodiments, the method for decompressing the XML document compressed by the above compressing method may comprise:

obtaining the compressed path coding of the node and compressed document structure information;

decompressing the compressed path coding of the node and outputting the node corresponding to the decompressed path coding; and decompressing the compressed document structure information, determining the compressed data content corresponding to the decompressed node according to the decompressed document structure information, and decompressing and outputting the determined data content.

In some embodiments, the device for decompressing the XML document compressed by the above compressing device may comprise:

an obtaining unit configured to obtain the compressed path coding of the node and compressed document structure information;

a decompressing unit configured to decompress the compressed path coding of the node and the compressed document structure information;

a data determining unit configured to determine the compressed data content corresponding to the decompressed node according to the decompressed document structure information; and an outputting unit configured to output the node corresponding to the path coding decompressed by the decompressing unit, and output the data content determined by the data determining unit.

Accordingly, the decompressing method provided in some embodiments of the present application may comprise: after the compressed path coding of the node, the compressed path coding of the data content, and the compressed document structure information are obtained and decompressed, outputting the node corresponding to the decompressed path coding; determining the compressed data content having a path coding identical to the decompressed path coding of the node, and decompressing and outputting the determined data content. Hence, such a method can decompress an XML document compressed by the compressing method disclosed herein.

In order to solve the problem in the art that a compressed XML document having a corresponding Schema cannot be queried, according to another aspect of this disclosure, a method and a device for querying an XML document compressed by the above compressing method are provided herein.

In some embodiments, the method for querying an XML document may comprise:

converting an input query path into a path coding by a preset converting method; and searching for a node corresponding to the converted path coding in the compressed XML document, and outputting the obtained node as a query result; or searching for a node corresponding to the converted path coding in the compressed XML document and data content corresponding to the obtained node in the compressed XML document, and outputting the obtained node and data content as a query result.

In some embodiments, the device for querying an XML document may comprise:

a converting unit configured to convert an input query path into a path coding by a preset converting method;

a node searching unit configured to search for a node corresponding to the converted path coding in the compressed XML document; and an outputting unit configured to output the node obtained by the node searching unit as a query result.

The device may include a data searching unit configured to search for data content corresponding to the node obtained by the node searching unit. The output unit or another output unit may be used to output the data content obtained by the data searching unit as a query result.

In the querying method provided in some embodiments of the present application, since the storage path of the node and/or data content is a path coding in an XML document having a corresponding Schema and compressed by the compressing method disclosed herein, it is possible to query the node and/or data content and output the queried node and/or data content as a query result after the query path is converted into a path coding. Hence, such a method can query an XML document having a corresponding Schema.

DETAILED DESCRIPTION OF CERTAIN EMBODIMENTS

In some embodiments of the present application, a method for compressing an XML document having a corresponding Schema is provided. The method may comprise: extracting structure content and data content of an XML document; determining path coding of a node and path coding of data content, respectively; compressing respectively the path coding of the node, the path coding of the data content, and the data content. The examples described herein refer to "a node" or "the node," however, a person having ordinary skill in the art should appreciate that the description may apply to multiple nodes.

Figure 1:
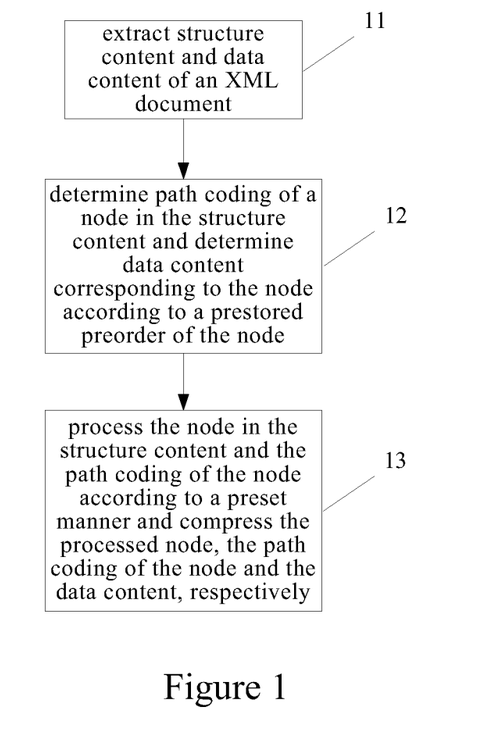
FIG. 1 shows a flow chart of a method for compressing an XML document having a corresponding Schema according to an embodiment of the present application.

Specifically, according to some embodiments, as shown in FIG. 1, the method may comprise the following steps.

Step 11 may comprise extracting structure content and data content of an XML document; wherein the structure content may include the content in labels (or tags) of the XML document excluding attribute values in the labels and content between the labels.

Step 12 may comprise determining path coding of a node in the structure content; and determining the data content corresponding to the node according to a pre-stored preorder of the node; wherein the path coding of the node identifies a storage position of the node in the structure content through the node and other nodes in the structure content.

Step 13 may comprise processing the node in the structure content and the path coding of the node by a preset method, and compressing respectively the processed node, the processed path coding of the node, and the data content.

In some embodiments, step 12 may comprise:

replacing each node included in an actual path, which corresponds to the node in the structure content, with a corresponding node coding; using a path obtained after the replacement as the path coding of the node in the structure content; wherein the actual path of the node identifies an actual storage path of the node in the structure content through the node and other nodes in the structure content.

In some embodiments, to facilitate the subsequent decompression operation, the compressing method disclosed herein may also comprise generating document structure information of the XML document, and compressing the document structure information; wherein the document structure information comprises a preorder of the node and a preorder of the data.

In some embodiments of the present application, a method for decompressing an XML document compressed by the compressing method disclosed herein is provided. The method may output the node corresponding to the decompressed path coding, after obtaining and decompressing the compressed path coding of the node, the compressed path coding of the data content, and the compressed document structure information; determine the compressed data content having a path coding identical to the decompressed path coding of the node according to the decompressed document structure information, and decompress and output the determined data content.

Figure 2:
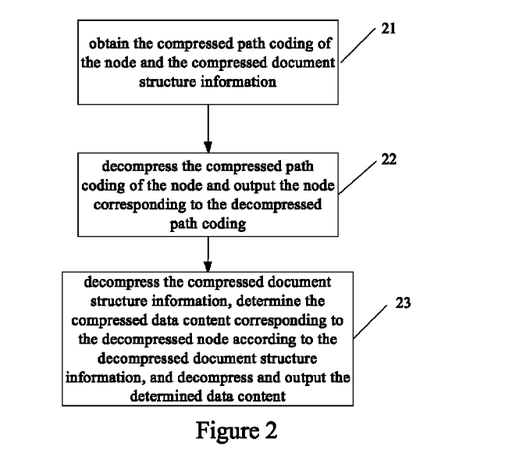
FIG. 2 shows a flow chart of a method for decompressing an XML document according to an embodiment of the present application.

In some embodiments as shown in FIG. 2, the method may comprise the following steps.

Step 21 may comprise obtaining the compressed path coding of the node and the compressed document structure information.

Step 22 may comprise decompressing the compressed path coding of the node and outputting the node corresponding to the decompressed path coding.

Step 23 may comprise decompressing the compressed document structure information, determining the compressed data content corresponding to the decompressed node according to the decompressed document structure information, and decompressing and outputting the determined data content.

In some embodiments, since the XML document compressed by the compressing method disclosed herein may comprise the preorder of the node and the preorder of the data content, the process for determining the compressed data content corresponding to the decompressed node according to the decompressed document structure information in Step 23 may further comprise:

when the sequence length of the preorder of the data content corresponding to the path coding identical to the decompressed path coding of the node is not zero, determining compressed data content corresponding to a preorder which differs by one from the preorder of the decompressed node as the compressed data content having a path coding identical to the decompressed path coding of the node.

In some embodiments of the present application, a method for querying an XML document compressed by the compressing method disclosed herein is provided. Since the storage path of the node and/or data content is a path coding in an XML document having a corresponding Schema and compressed by the compressing method disclosed herein, it is possible to query the node and/or data content and output the queried node and/or data content as a query result after the query path is converted into a path coding.

Figure 3:
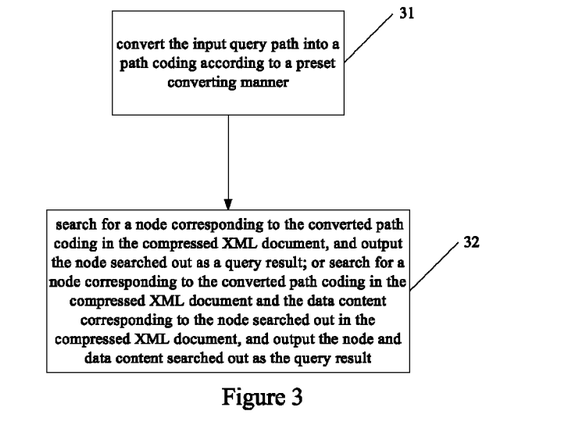
FIG. 3 shows a flow chart of a method for querying an XML document according to an embodiment of the present application.

In some embodiments as shown in FIG. 3, the method may comprise the following steps.

Step 31 may comprise converting an input query path into a path coding by a preset converting method.

Step 32 may comprise searching for a node corresponding to the converted path coding in the compressed XML document, and outputting the obtained node as a query result; or searching for a node corresponding to the converted path coding in the compressed XML document and data content corresponding to the obtained node in the compressed XML document, and outputting the obtained node and data content as a query result.

In some embodiments, Step 31 may further comprise:

converting a node included in the query path into a node coding corresponding to the node, and using the converted path as the path coding of the query path.

In some embodiments, since the XML document compressed by the compressing method disclosed herein may comprise the preorder of the data content, searching for a node corresponding to the converted path coding in the compressed XML document in Step 32 may comprise:

when the last node coding in the converted path coding includes a predicate, searching for a node corresponding to a path coding identical to the path coding of the converted path coding in the compressed XML document; if the number of the obtained node is one, and the obtained node is a node determined by a first path coding, using the obtained node as the node corresponding to the converted path coding; if the number of the obtained nodes is more than one, determining one or more nodes from the obtained nodes according to the predicate, and using the one or more determined nodes as the nodes corresponding to the converted path coding, wherein the predicate denotes one or more nodes corresponding to the first path coding, and the first path coding is a path coding determined by the node coding in the converted path coding including the predicate and each node coding before the node coding including the predicate; or when a node coding in the converted path coding includes a predicate, which is not the last node coding, searching for a node corresponding to a path coding identical to the first path coding in the compressed XML document; if the number of the obtained node is one, and the obtained node is a node determined by the first path coding, searching for a path coding which is identical to the converted path coding and comprises node coding corresponding to the obtained node in the compressed XML document, and using the node corresponding to the obtained path coding as the node corresponding to the converted path coding; if the number of the obtained nodes is more than one, determining one or more nodes from the obtained nodes according to the predicate, searching for a path coding which is identical to the converted path coding and comprises the node coding corresponding to the one or more nodes determined from the obtained nodes in the compressed XML document, and using the node corresponding to the obtained path coding as the node corresponding to the converted path coding.

In some embodiments, since the XML document compressed by the compressing method disclosed herein may comprise the preorder of the node, searching for data content corresponding to the converted path coding in Step 32 may further comprise:

searching for data content corresponding to a path coding identical to the converted path coding in the compressed XML document;

if the number of the obtained data content in the search result is one, using the obtained data content as the data content corresponding to the converted path coding; and if the number of the obtained data contents in the search result is more than one, determining, from the obtained data contents, data content corresponding to a preorder which differs by one from the preorder of the obtained node, and using the determined data content as the data content corresponding to the converted path coding.

In some embodiments, the Schema structure may comprise a site node, regions node, namerica node, item node, id node, location node, categories node, complexType node, sequence indicator, and choice indicator. For example, the Schema structure of an exemplary XML document having a corresponding Schema may be shown as follows:

```
<?xml version="1.0" encoding="UTF-8">
    <xs:schema xmlns:xs="http://www.w3.org/2001/xmlschema">
        < xs:element name="root" type="t1"/>
        < xs: complexType name="t1" >
            < xs:sequence maxOccurs="3" >
                < xs:choice maxO ccurs="2" >
                    <xs:element name="e1" type="xs:int"
                    minOccurs="0"/>
                    <xs:element name="e2" type="xs: string"
                    minOccurs="0"/>
                    <xs:element name="e3" type="xs:int"
                    minOccurs="0"/>
                </xs:choice>
            </xs: sequence>
        </xs: sequence>
        </xs: complexType>
    </xs: schema>
```

Figure 4:
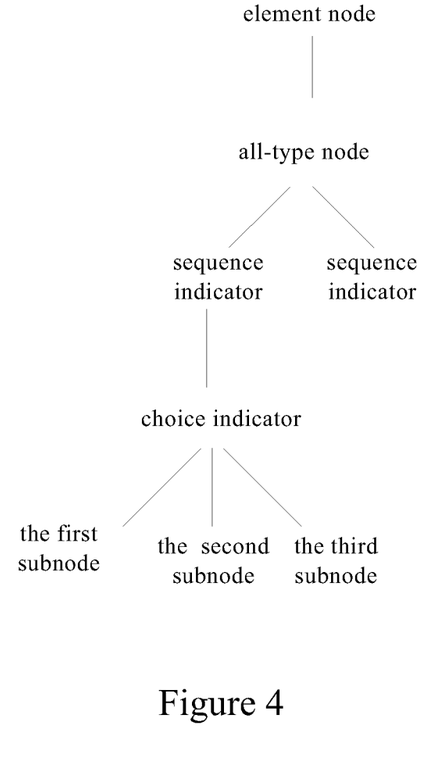
FIG. 4 shows a schematic structure of a Schema in an XML document according to an embodiment of the present application.

The schema may comprise a sequence indicator comprising a choice indicator and a sequence indicator without a subnode. The choice indicator may comprise three subnodes: the first subnode e1, the second subnode e2, and the third subnode e3. These three subnodes may be all optional. The tree structure corresponding to the schema structure is shown in FIG. 4.

Certain examples of the present application will be described below.

Figure 5:
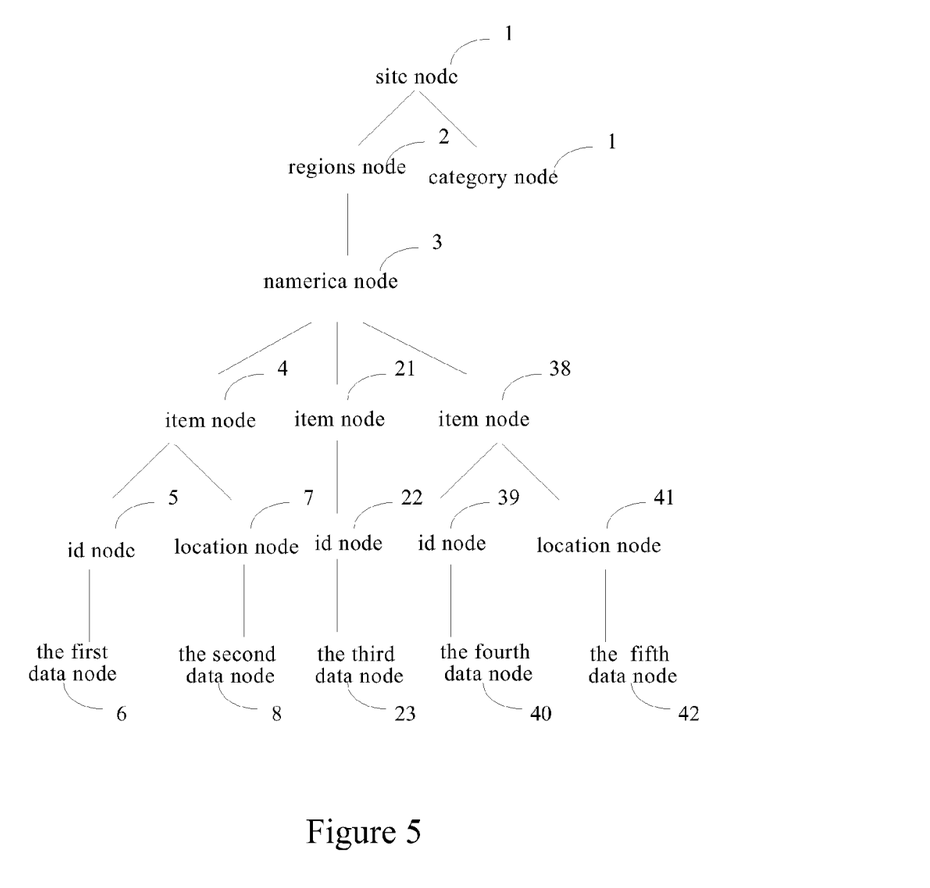
FIG. 5 is a schematic structure of a Schema in an XML document according to an embodiment of the present application.

For convenience, all the examples below use an XML document having the structure shown in FIG. 5. The data content corresponding to the first data node is item0, the data content corresponding to the second data node is US, the data content corresponding to the third data node is item1, the data content corresponding to the fourth data node is item2, and the data content corresponding to the fifth data node is CA. A preorder traversal is performed on the structure to obtain the preorders of all the nodes, as shown in FIG. 5. The XML document has a corresponding Schema structure comprising a Schema node.

EXAMPLE 1

The example 1 of the present application provides a method for compressing an XML document having a corresponding Schema. The method comprises: first, extracting structure content and data content of an XML document; second, determining path coding of the node and path coding of the data content, respectively; finally, compressing respectively the path coding of the node, the path coding of the data content, and the data content. The method comprises the following steps:

step A, extracting structure content and data content of an XML document according to a preset extraction method, wherein the structure content comprises the content in labels of the XML document excluding attribute values in the labels and the content between the labels; the data content comprises the attribute values in the labels and the content between the labels in the XML document;

step B, allocating respectively preset node numbers for the nodes, such as the site, regions, namerica, item, id, location, categories, category nodes in the Schema nodes, wherein each node number corresponds to a unique Schema node; for example, the node number allocated for the site, regions, namerica, item, id, location, categories, category nodes are 1, 2, 3, 4, 5, 6, respectively; and step C, determining the path coding of all the nodes in the structure content; determining the data content corresponding to the node according to the pre-stored preorder of the node; the difference between the preorder of the node and the preorder of the data content corresponding to the node is one; therefore, the path coding of the data content is the same as the path coding of the node of the data content.

The path coding of the node identifies the storage position of the node in the structure content through the node and other nodes in the structure content.

In some embodiments, the step of determining the path coding of all the nodes in the structure content comprises:

replacing each node included in an actual path, which corresponds to the node in the structure content, with a corresponding node coding; using a path obtained after the replacement as the path coding of the node in the structure content; the actual path of the node identifies an actual storage position of the node in the structure content through the node and other nodes in the structure content; for example, the actual path of node "namerica" is obtained, which is "/site/regions/namerica"; according to a preset node number, the path coding of the node "namerica" is "/1/2/3"; according to the path coding, the preorder of node "namerica" can be determined as 3, and a coding preorder obtained after performing difference coding operation (calculating the difference between preorders of two successive nodes) on the preorder is 3; in the same manner, the path coding, preorder, and coding preorder of all the Schema nodes can be obtained; and when the actual path of the data content corresponding to the location node is "/site/regions/namerica/item/location", the path coding of the actual path is "/1/2/3/4/6"; according to the path coding, the data contents corresponding to the path coding can be determined as "CA" and "US"; the preorders corresponding to the path coding are 42 and 8.

With the above method for obtaining the actual path, path coding, preorder, coding preorder of all the nodes and data content, the obtained result is shown in table 1.

TABLE 1

| actual path | path coding | preorder | coding preorder | data content |
|---|---|---|---|---|
| Internal Node: | | | | |
| /site/regions/namerica | /1/2/3 | 3 | 3 | — |
| /site/regions/namerica/item | /1/2/3/4 | 4 21 38 | 3 17 17 | — |
| /site/regions/namerica/item/@id | /1/2/3/4/5 | 5 22 39 | 5 17 17 | — |
| /site/regions/namerica/item/location | /1/2/3/4/6 | 7 41 | 7 34 | — |
| ... | | | | |
| Text Node: | | | | |
| /site/regions/namerica/item/@id | /1/2/3/4/5 | 6 23 40 | 6 17 17 | item0 item1 item2 |
| /site/regions/namerica/item/location | /1/2/3/4/6 | 8 42 | 8 34 | US CA |
| ... | | | | |

The method further comprises:

step D, compressing respectively the path coding of the node, the node, and the data content corresponding to the node; for example, the data content can be compressed by any method known in the art; and step E, storing the compressed data content, the compressed path coding of the node, and other information into a compressed XML document.

In some embodiments, in order to simplify the structure of the XML document, the above method may also comprise before step A: optimizing the schema structure of the XML document by a preset optimization method; and storing the optimized information in a bsg file; wherein the bsg file may comprise: the node name of the Schema node, the number of the subnodes of the Schema node, the type of the Schema node, wherein the type may comprise the data type and the node type, the type of the indicator of the Schema node, the times of occurrence of the indicator, and the data in the structure content and the XML document, wherein the type of the indicator may comprise an "all" indicator, "choice" indicator and "sequence" indicator. The optimization method may be a method known in the art.

In some embodiments, in order to enhance the compressing effect, the above method may also comprise between steps C and D: preprocessing the data content by a preset method; wherein the preset method may be any method known in the art, for example, a Lempel-Ziv-Welch (LZW) method.

In some embodiments, the step of preprocessing the structure content by a preset method may comprise: generating document structure information and compressing the document structure information in the compressing process; wherein the document structure information may comprise the length of the preorder of the data content; the document structure information may also comprise, and for example, in the order of: the length of a preorder sequence of the path, the preorder sequence of the path, the length of a preorder sequence of the data content corresponding to the path, and the non-deterministic structure content corresponding to the path; the preorder sequence of the path includes a combination of the preorders of all the nodes; the non-deterministic structure content comprises the length of the non-deterministic structure content, the times of occurrence of the indicator of the node in the path, the number of the subnodes of the node in the path. When the node comprises a plurality of subnodes, the plurality of subnodes are arranged in order by the preorder values of these subnodes; the preorder sequence of the path determines the order of the node structure content of each Schema node in the structure content.

In some embodiments, in order to enhance the compressing efficiency, the preorder sequence of the path comprises a combination of the coding preorders of all the nodes in the path.

For example, a binary tree structure of an optimized XML document is shown in FIG. 5. After a preorder traversal is performed on the binary tree, a part of document structure information of the XML document is:

1 1 0 3 2 0 1; 1 2 0 1 3; 1 3 0 0; 3 4 17 17 0 . . . .

In a compressed XML document, the path sequence of the path of each node may be stored in order in advance. Here, the path can be either an actual path or a path coding, both of which are called as path below for convenience. If the path coding is used, the storage space may be significantly saved. The path sequence may comprise a preorder sequence coding of the path, and a path corresponding to the preorder sequence coding. The preorder sequence may comprise a combination of the coding preorders of all the nodes in the path. For example, the preorder sequence of /site path is 1, the preorder sequence of /site/regions path is 2, and the preorder sequence of /site/regions/namerica path is 3.

"1 1 0 3 2 0 1" denotes: the length of the path preorder sequence is 1, so the preorder sequence of the read path is 1, i.e., /site path, and the length of the preorder sequence of data content corresponding to the path is 0, i.e., there is no data content corresponding to the path; the length of non-deterministic structure content of the path is 3, so as to read three data contents "201" whose length of non-deterministic structure content is 3; it can be known from the bsg file that the indicator of the node in the path is a choice indicator, so "201" denotes that the choice indicator occurred twice, choosing the first subnode of site node, i.e., regions node, at the first time, and choosing the second subnode of site node, i.e., categories node, at the second time.

"1 2 0 1 3" denotes: the length of the path preorder sequence is 1, so the preorder sequence of the read path is 2, i.e., /site/regions path, and the length of the preorder sequence of data content corresponding to the path is 0, i.e., there is no data content corresponding to the path; the length of non-deterministic structure content of the path is 1, so as to read one data content "3" whose length of non-deterministic structure content is 1; it can be known from the bsg file that the indicator of the node in the path is a sequence indicator, so "3" denotes that the sequence indicator occurred three times.

"1 3 0 0" denotes: the length of the path preorder sequence is 1, so the preorder sequence of the read path is 3, i.e., /site/regions/namerica path, and the length of the preorder sequence of data content corresponding to the path is 0, i.e., there is no data content corresponding to the path; the length of non-deterministic structure content of the path is 1, so as to read one data content "3" whose length of non-deterministic structure content is 1; it can be known from the bsg file that the indicator of the node in the path is a sequence indicator, so "3" means that the sequence indicator occurred three times.

EXAMPLE 2

The example 2 of the present application provides a method for decompressing an XML document compressed by the above compressing method. The method can output the node corresponding to the decompressed path coding after obtaining and decompressing the compressed path coding of the node, the compressed path coding of the data content, and the compressed document structure information; determine the compressed data content corresponding to the decompressed node, and decompress and output the determined data content. The method comprises the following steps:

step 1, determining whether there is a binary schema graph (bsg) file in the XML document. If so, going to step 2; the bsg file comprises: the node name of the Schema node, the number of the subnodes of the Schema node, the type of the Schema node, wherein the type comprises the data type and the node type; the type of the indicator of the Schema node, the times of occurrence of the indicator, and the data in the structure content and the XML document; the type of the indicator comprises an "all" indicator, "choice" indicator and "sequence" indicator;

step 2, resolving the bsg file, and obtaining the compressed path coding of the node, the compressed data content, and the compressed document structure information;

step 3, decompressing the compressed path coding of the node, and outputting the node corresponding to the decompressed path coding; for convenience, taking decompressing the "site" node and its subnode in the XML document as an example, according to the path coding of the "site" node, outputting the "site" node and the label information corresponding to the "site" node, such as <site> and <site>; according to the structure content "1 1 0 3 2 0 1", determining that the "site" node has two subnodes, outputting the label information corresponding to the two subnodes, respectively, and outputting the label information corresponding to the rest of the subnodes of the "site" node sequentially; and step 4, decompressing the compressed document structure information, determining the compressed data content having a path coding identical to the decompressed path coding of the node, and decompressing and outputting the determined data content; the method for determining the compressed data according to the decompressed document structure information and the output node in this step comprises:

since the XML document comprises the preorder of the node and the preorder of the data content, when the sequence length of the preorder of the data content corresponding to the path coding identical to the decompressed path coding of the node is not zero, determining data content corresponding to a preorder which differs by one from the decompressed preorder of the node as the compressed data content having the path coding identical to the decompressed path coding of the node; for example, a certain decompressed path coding of a node is /1/2/3/4/6 according to the document structure information, it can be determined that the sequence length of the preorder of the data content corresponding to the path coding is not zero, and that the preorder of the node corresponding to the path coding is 7, so the data contents having the path coding /1/2/3/4/6 are "US" and "CA", the preorder of "US" is 8, the preorder of "CA" is 42, and the preorder of the data content of the node is the preorder of the node plus 1; therefore, the data content "US" corresponding to the preorder "8" is considered as the desired data content.

EXAMPLE 3

The example 3 of the present application provides a method for querying an XML document compressed by the above compressing method. Since the storage path of the node and/or data content in an XML document having a corresponding schema is path coding after being compressed by the above method, it is possible to query the node and/or data content after converting the query path into a path coding, and output the queried node and/or data content as a query result; in this step, the XML document comprises a bsg file comprising: the node name of the Schema node, the number of the subnodes of the Schema node, the type of the Schema node, wherein the type comprises the data type and the node type; the type of the indicator of the Schema node, the times of occurrence of the indicator, and the data in the structure content and the XML document; the type of the indicator comprises an "all" indicator, "choice" indicator and "sequence" indicator; the bsg file also comprises the "start" label and "end" label corresponding to the schema node; this querying method comprises the following steps.

step 1, converting an input query path into a path coding by a preset converting method; i.e., converting the node included in the query path into a node coding corresponding to the node, and using the converted path as the path coding of the query path; for example, the node numbers allocated for site, regions, namerica, item, id, location, categories, category node are 1, 2, 3, 4, 5, 6, respectively.

In this step, when the query path is a simple query, for example, /site/regions/namerica/item/location, converting the node in the query path into a node coding corresponding to the node, and the converted path coding is 1/2/3/4/6.

When the query path has a predicate, for example, /site/regions/namerica/item[2]/location (where [2] is the predicate), converting the node in the query path into a node coding corresponding to the node, and the converted path coding is 1/2/3/4[2]/6; wherein the predicate denotes the one or more nodes corresponding to a first path coding, and the first path coding is a path coding determined by the node coding in the converted path coding having the predicate and each node coding before the node coding having the predicate, for example, if the first path is 1/2/3/4, the predicate is [2]/.

When the query path is a non-deterministic query, for example, //item, the converted path coding is //4; when a traversal search is performed in a binary tree, every node corresponding to an item node is the result of the query, for example, /1/2/3/4.

step 2, searching for a node corresponding to the converted path coding in the compressed XML document, and outputting the obtained node as a query result.

When the query path is a simple path, the searching method is as follows:

searching for a location node to be queried which has the path coding "1/2/3/4/6" in the structure content, when it is determined that the location node to be queried has no subnode according to the document structure information, outputting label information corresponding to the node to be queried, for example, <location> </location>.

When the path to be queried has a predicate, the searching method is as follows:

First, when the last node coding in the converted path coding comprises a predicate, searching for the node corresponding to a path coding identical to the converted path coding in the compressed XML document; if the number of the obtained node is one, and the obtained node is a node determined by a first path coding, using the obtained node as the node corresponding to the converted path coding; if the number of the obtained nodes is more than one, determining one or more nodes from the obtained nodes according to the predicate, and using the one or more determined nodes as the nodes corresponding to the converted path coding, wherein the predicate denotes the one or more nodes corresponding to the first path coding, and the first path coding is a path coding determined by the node coding in the converted path coding having the predicate and each node coding before the node coding having the predicate. For example, when the path coding to be queried is /1/2/3/4[2], searching the nodes corresponding to the path coding according to /1/2/3/4, i.e. three item nodes, searching the second item node from all the obtained nodes according to the predicate, and using the obtained second item node as the node corresponding to the converted path coding; and Second, when a node coding in the converted path coding comprises a predicate, which is not the last node, searching for the node corresponding to a path coding identical to the first path coding in the compressed XML document; if the number of the obtained node is one, and the obtained node is a node determined by the first path coding, searching for a path coding which is identical to the converted path coding and comprises the node coding corresponding to the obtained node in the compressed XML document; using the node corresponding to the obtained path coding as the node corresponding to the converted path coding; if the number of the obtained nodes is more than one, determining one or more nodes from the obtained nodes according to the predicate; searching for a path coding which is identical to the converted path coding and comprises the node coding corresponding to the one or more nodes determined from the obtained nodes in the compressed XML document; using the node corresponding to the obtained path coding as the node corresponding to the converted path coding. For example, when the path coding to be queried is /1/2/3/4[2]/5, searching for the nodes corresponding to the path coding according to /1/2/3/4, i.e. three item nodes, searching the second item node from all the obtained nodes according to the predicate, and determining that the coding path comprising the searched second item node is /1/2/3/4/5, therefore, determining the node corresponding to /1/2/3/4[2]/5 as "id" node, and using the obtained "id" node as the node corresponding to the converted path coding.

When the path coding to be queried is /1/2/3/4[2]/6, it can be known from Table 1 that the preorder of this "item" node is 21, and that the preorders of the subnodes of this node are between 21 and 38. Therefore, if there is no such subnode whose preorder of "location" node is between 21 and 38, the searching is failed.

When the path coding to be queried is a non-deterministic query path, searching for all the path in which the last node is an "item" node; then querying all the subnodes of the "item" node by the method of querying subnodes in the simple query path and outputting the query result.

When it is determined that there is data content corresponding to the path coding to be searched according to the document structure information, searching for the data content corresponding to the converted path coding, the searching method comprising:

searching for data content corresponding to a path coding identical to the converted path coding in the compressed XML document;

if the number of the obtained data content in the search result is one, using the obtained data content as the data content corresponding to the converted path coding;

if the number of the obtained data content in the search result is more than one, determining, from the obtained data contents, data content corresponding to the preorder which differs by one from the preorder of the obtained node. The detailed process is similar to that in Example 2.

Figure 6:
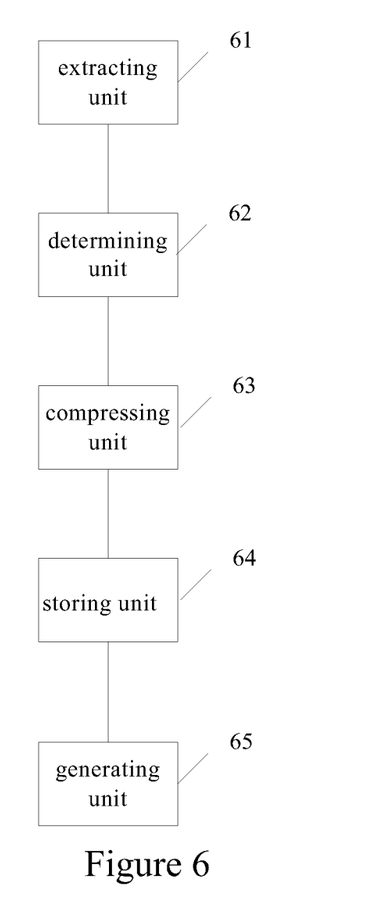
FIG. 6 shows a schematic structure of a device for compressing an XML document having a corresponding Schema according to an embodiment of the present application.

In some embodiments of the present applications shown in FIG. 6, a device for compressing an XML document having a corresponding Schema is provided. The device may comprise:

an extracting unit 61 for extracting structure content and data content of an XML document, wherein the structure content comprises the content in labels of the XML document excluding attribute values in the labels and content between the labels;

a determining unit 62 for determining path coding of a node in the structure content, and determining data content corresponding to the node according to a pre-stored preorder of the node, wherein the path coding of the node identifies a storage position of the node in the structure content through the node and other nodes in the structure content; and a compressing unit 63 for processing the node in the structure content and the path coding of the node by a preset method, and compressing respectively the processed node, the processed path coding of the node, and the data content.

In some embodiments, the determining unit 62 may be used for:

replacing each node included in an actual path, which corresponds to the node in the structure content, with a corresponding node coding; using a path obtained after the replacement as the path coding of the node in the structure content; wherein the actual path of the node identifies an actual storage path of the node in the structure content through the node and other nodes in the structure content.

In some embodiments, the device may further comprise a storing unit 64 for storing compressed data.

In some embodiments, the device may further comprise a generating unit 65 for generating document structure information during compression, wherein the document structure information comprises a preorder of the data and the sequence length of a preorder of the data content.

In some embodiments, the compressing unit 63 may also be used for compressing the document structure information generated by the generating unit 65.

Figure 7:
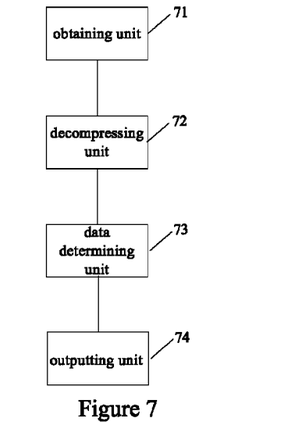
FIG. 7 shows a schematic structure of a device for decompressing an XML document according to an embodiment of the present application.

In some embodiments of the present application as shown in FIG. 7, a device for decompressing an XML document compressed by the compressing device disclosed herein is provided. The decompressing device may comprise:

an obtaining unit 71 for obtaining a compressed path coding of a node and compressed document structure information;

a decompressing unit 72 for decompressing the compressed path coding of the node and the compressed document structure information;

a data determining unit 73 for determining the compressed data content corresponding to the decompressed node according to the decompressed document structure information;

an outputting unit 74 for outputting the node corresponding to the path coding decompressed by the decompressing unit 72, and outputting the data content determined by the data determining unit 73. The device may also decompress the determined compressed data content, for example, by the decompressing unit 72, and then output the data content.

In some embodiments, the XML document may comprise the preorder of the node and the preorder of the data content. The data determining unit 73 may be further used for:

when the sequence length of the preorder of the data content corresponding to a path coding identical to the decompressed path coding of the node is not zero, determining the data content corresponding to a preorder which is larger than the preorder of the node and smaller than the preorder of the next node in the path as the data content corresponding to the decompressed node.

Figure 8:
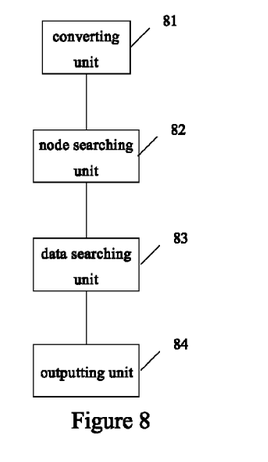
FIG. 8 shows a schematic structure of a device for querying an XML document according to an embodiment of the present application.

In some embodiments of the present application as shown in FIG. 8, a device for querying an XML document compressed by the compressing device disclosed herein is provided. The querying device may comprise:

a converting unit 81 for converting an input query path into a path coding by a preset converting method;

a node searching unit 82 for searching for a node corresponding to the converted path coding in the compressed XML document;

a data searching unit 83 for searching for data content corresponding to the node obtained by the node searching unit 82; and an outputting unit 84 for outputting the node obtained by the node searching unit 82 as a query result; or outputting the node obtained by the node searching unit 82 and the data content obtained by the data searching unit 83 as a query result.

In some embodiments, the converting unit 81 may be used for:

converting the node included in the query path into the node coding corresponding to the node, and using the converted path as the path coding of the query path.

In some embodiments, the node searching unit 82 may be used for:

when the last node coding in the converted path coding comprises a predicate, searching for the node corresponding to a path coding identical to the path coding of the converted path coding in the compressed XML document; if the number of the obtained node is one, and the obtained node is a node determined by a first path coding, using the obtained node as the node corresponding to the converted path coding; if the number of the obtained nodes is more than one, determining one or more nodes from the obtained nodes according to the predicate, and using the one or more determined nodes as the nodes corresponding to the converted path coding, wherein the predicate denotes one or more nodes corresponding to the first path coding, and the first path coding is a path coding determined by the node coding in the converted path coding having the predicate and each node coding before the node coding having the predicate; or when a node coding in the converted path coding comprises a predicate, which is not the last node, searching for the node corresponding to a path coding identical to the first path coding in the compressed XML document; if the number of the obtained node is one, and the obtained node is a node determined by the first path coding, searching for a path coding which is identical to the converted path coding and comprises the node coding corresponding to the obtained node in the compressed XML document, and using the node corresponding to the obtained path coding as a node corresponding to the converted path coding; if the number of the obtained nodes is more than one, determining one or more nodes from the obtained nodes according to the predicate, searching for a path coding which is identical to the converted path coding and comprises the node codings corresponding to the one or more nodes determined from the obtained nodes in the compressed XML document, and using the node corresponding to the obtained path coding as the node corresponding to the converted path coding.

In some embodiments, the data searching unit 83 may be used for:

searching for data content corresponding to a path coding identical to the converted path coding in the compressed XML document;

if the number of the obtained data content is one, using the obtained data content as the data content corresponding to the converted path coding; and if the number of the obtained data contents is more than one, determining, from the obtained data contents, data content corresponding to a preorder which differs by one from the preorder of the obtained node, and using the determined data content as the data content corresponding to the converted path coding.

The compressing method provided in some embodiments of the present application extracts structure content and data content of an XML document; determines path coding of a node and path coding of the data content, respectively; compresses respectively the path coding of the node, the path coding of the data content, and the data content. It can be seen that such a method can compress an XML document having a corresponding Schema.

The decompressing method provided in some embodiments of the present application outputs the node corresponding to the decompressed path coding, after the compressed path coding of the node, the compressed path coding of the data content, and the compressed document structure information are obtained and decompressed; determines the compressed data content having a path coding identical to the decompressed path coding of the node, and decompresses and outputs the determined data content. It can be seen that such a method can decompress an XML document compressed by the compressing method disclosed herein.

A querying method is also provided in some embodiments of the present application. Since the storage path of the node and/or data content is a path coding in an XML document having a corresponding Schema and compressed by the compressing method disclosed herein, it is possible to query the node and/or data content after the query path is converted into a path coding, and output the queried node and/or data content as a query result. Such a method can query an XML document having a corresponding Schema and compressed by the compressing method disclosed herein.

A person with ordinary skill in the art will understand that the embodiments of the present application can be a method, a system, or a computer program product. Therefore, the embodiments of the present application may be adopted as a full hardware, a full software, or a combination thereof. In addition, the embodiments of the present application may be adopted as a computer program product embodied on one or more computer-readable storage mediums (comprising but not limited to disk storage, CD-ROM, optical memory and the like) containing a computer-readable program code.

The present application has been described with reference to the flow charts and/or block diagrams of the method, the device (the system), and the computer program product according to the some embodiments of the present application. It can be understood that each flow of the flow charts and/or each block of the block diagrams and the combination thereof can be implemented by computer program instructions. Such computer program instructions can be provided to a general computer, a specified computer, an embedded processor, or processors of other programmable data processing apparatus to generate a machine, such that a device is generated via the instructions executed on the computer or processor of other programmable data processing apparatus, and the device is configured to implement the specific function of one or more flows in the flow charts and/or one or more blocks in the block diagrams.

Such computer program instructions can also be stored in a computer readable memory which can direct the computer or other programmable data processing apparatus to work in a particular way, such that the instructions stored in the computer readable memory generate manufacture comprising command device which is configured to implement the specific function of one or more flows in the flow charts and/or one or more blocks in the block diagrams.

Such computer program instructions can also be loaded on a computer or other programmable data processing apparatus, such that a series of operation steps can be executed on the computer or other programmable data processing apparatus to generate a computer implemented processing so as to provide the progress which can implement the specific function of one or more flows in the flow charts and/or one or more blocks in the block diagrams.

Although the preferable embodiments of the present application have been described, various changes and modifications to the embodiments can be made once the skilled in the art have learned the basic creative concept. Thus, the appended claims intend to be explained as comprising the preferable embodiments and all the changes and modifications within the scope of the invention.

Apparently, various variants and modifications to the invention can be made by the skilled in the art without departing from the spirit and scope of the present invention. If such variants and modifications to the invention belong to the scope of the claims and their equivalents, the invention intends to comprise such variants and modifications.

The invention claimed is:

1. A computer-implemented method for processing an XML document having a corresponding Schema, the method comprising a compressing stage and a decompressing stage, wherein the compressing stage comprises:

extracting structure content and data content of the XML document;

determining path coding of a node in the structure content, and data content corresponding to the node according to a pre-stored preorder of the node, wherein the path coding of the node identifies a storage position of the node in the structure content;

compressing the determined path coding of the node and the determined data content, and generating document structure information during the compression, wherein the document structure information comprises a preorder of the node and a preorder of the determined data content; and compressing the generated document structure information; and wherein the decompressing stage comprises:
obtaining the compressed path coding of the node and compressed document structure information;
decompressing the compressed path coding of the node to obtain the node corresponding to the decompressed path coding; and
decompressing the compressed document structure information;
when a sequence length of the preorder of the data content corresponding to a path coding identical to the decompressed path coding of the node is not zero the method further comprises:
determining data content corresponding to a preorder which is larger than the preorder of the decompressed node and smaller than a preorder of a next node in a path as the data content corresponding to the decompressed node.

2. The method according to claim 1, wherein the determining path coding of a node in the structure content comprises:
replacing, with a corresponding node coding, each node included in an actual path corresponding to the nodes in the structure content; and
using a path obtained after the replacement as the path coding of the node in the structure content,
wherein the actual path of the node identifies an actual storage path of the node in the structure content.

3. The method according to claim 2, further comprising:
converting an input query path into a path coding;
searching for a node corresponding to the converted path coding in the compressed XML document, and
outputting the obtained node as a query result.

4. The method according to claim 2, further comprising:
converting an input query path into a path coding; and
searching for a node corresponding to the converted path coding in the compressed XML document and data content corresponding to the obtained node.

5. The method according to claim 1, further comprising:
converting an input query path into a path coding;
searching for a node corresponding to the converted path coding in the compressed XML document, and
outputting the obtained node as a query result.

6. The method according to claim 5, wherein the step of converting an input query path into a path coding comprises:
converting nodes included in the query path into node coding corresponding to the nodes, and using the resulted node coding as the path coding of the query path.

7. The method according to claim 5, wherein the compressed XML document comprises the preorder of the data content, and
wherein the step of searching for a node corresponding to the converted path coding in the compressed XML document comprises:
when a last node coding in the converted path coding comprises a predicate, searching for a node corresponding to a path coding identical to the converted path coding in the compressed XML document; if the number of the obtained node is one, and the obtained node is a node determined by a first path coding, using the obtained node as the node corresponding to the converted path coding; if the number of the obtained nodes is more than one, determining one or more nodes from the obtained nodes according to the predicate, and using the one or more determined nodes as the nodes corresponding to the converted path coding, wherein the predicate denotes one or more nodes corresponding to the first path coding, and the first path coding is a path coding determined by the node coding in the converted path coding having the predicate and each node coding before the node coding having the predicate; or
when a node coding in the converted path coding comprises a predicate, which is not the last node in the converted path coding, searching for a node corresponding to a path coding identical to a first path coding in the compressed XML document; if the number of the obtained node is one, and the obtained node is a node determined by the first path coding, searching for a path coding which is identical to the converted path coding and comprises the node coding corresponding to the obtained node in the compressed XML document, and using the node corresponding to the obtained path coding as the node corresponding to the converted path coding; if the number of the obtained nodes is more than one, determining one or more nodes from the obtained nodes according to the predicate, searching for a path coding which is identical to the converted path coding and comprises the node codings corresponding to the one or more nodes determined from the obtained nodes in the compressed XML document, and using the node corresponding to the obtained path coding as the node corresponding to the converted path coding.

8. The method according to claim 1, further comprising:
converting an input query path into a path coding; and
searching for a node corresponding to the converted path coding in the compressed XML document and data content corresponding to the obtained node.

9. The method according to claim 8,
wherein the XML document comprises the preorder of the node and the preorder of the data content, and
wherein the searching for data content corresponding to the obtained node comprises:
searching for data content corresponding to a path coding identical to the converted path coding in the compressed XML document;
if the number of the obtained data content is one, using the obtained data content as the data content corresponding to the converted path coding; and
if the number of the obtained data contents is more than one, determining, from the obtained data content, data content corresponding to a preorder which differs by one from the preorder of the obtained node, and using the determined data content as the data content corresponding to the converted path coding.

10. A system for processing an XML document having a corresponding Schema, the system comprising a compressing device and a decompressing device,
wherein the compressing device comprises:
an extracting unit, implemented by a processor, configured to extract structure content and data content of an XML document;
a determining unit, implemented by the processor, configured to determine path coding of a node in the structure content, and determine data content corresponding to the node according to a pre-stored preorder of the node, wherein the path coding of the node identifies a storage position of the node in the structure content; and
a compressing unit, implemented by the processor, configured to compress the path coding of the node and the data content, and
a generating unit configured to generate document structure information during compression, wherein the document structure information comprises a preorder of the data content and a sequence length of the preorder of the data content, wherein the compressing unit is also configured to compress the document structure information, wherein the compressing device comprises:

an obtaining unit configured to obtain the compressed path coding of the node and the compressed document structure information; and a decompressing unit configured to decompress the compressed path coding of the node and the compressed document structure information; and a data determining unit configured to determine the compressed data content corresponding to the decompressed node according to the decompressed document structure information, wherein the data determining unit is further configured to:

determine the data content corresponding to a preorder which is larger than the preorder of the decompressed node and less than a reorder of a next node in the path as the data content corresponding to the decompressed node, when a sequence length of a preorder of the data content corresponding to the path coding which is identical to the decompressed path coding of the node is not zero.

11. The system according to claim 10, wherein the determining unit is further configured to:

replace each node included in an actual path, which corresponds to the node in the structure content, with a corresponding node coding, and use a path obtained after the replacement as the path coding of the node in the structure content, wherein the actual path of the node identifies an actual storage path of the node in the structure content.

12. The system according to claim 11, further comprising:

a converting unit configured to convert an input query path into a path coding; and a node searching unit configured to search for a node corresponding to the converted path coding in the compressed XML document.

13. The system according to claim 10, further comprising:

a converting unit configured to convert an input query path into a path coding; and a node searching unit configured to search for a node corresponding to the converted path coding in the compressed XML document.

14. The system according to claim 13, further comprising:

a data searching unit configured to search for data content corresponding to the node obtained by the node searching unit; and an outputting unit configured to output the node obtained by the node searching unit as a query result; or output the data content obtained by the data searching unit as a query result.

15. The system according to claim 14, wherein the compressed XML document comprises a preorder of the node and a preorder of the data content, and wherein the data searching unit is further configured to:

search for data content corresponding to a path coding identical to the converted path coding in the compressed XML document;

if the number of the obtained data content is one, use the obtained data content as the data content corresponding to the converted path coding; and if the number of the obtained data contents is more than one, determine, from the obtained data contents, data content corresponding to a preorder which differs by one from the preorder of the obtained node, and use the determined data content as the data content corresponding to the converted path coding.

* * * * *

UNITED STATES PATENT AND TRADEMARK OFFICE
CERTIFICATE OF CORRECTION

| | | |
|---|---|---|
| PATENT NO. | : 8,768,900 B2 | Page 1 of 1 |
| APPLICATION NO. | : 14/119172 | |
| DATED | : July 1, 2014 | |
| INVENTOR(S) | : Ruiheng Qiu et al. | |

It is certified that error appears in the above-identified patent and that said Letters Patent is hereby corrected as shown below:

In the Claims

Column 17, Line 11, Claim 1, after "zero" insert -- , --

Column 19, Line 17, Claim 10, delete "reorder" and insert -- preorder --

Signed and Sealed this
Fourth Day of November, 2014

Michelle K. Lee
*Deputy Director of the United States Patent and Trademark Office*